United States Patent [19]
Bushman

[11] Patent Number: 6,028,434
[45] Date of Patent: Feb. 22, 2000

[54] METHOD AND APPARATUS FOR DETECTING EMITTED RADIATION FROM INTERRUPTED ELECTRONS

[75] Inventor: Boyd B. Bushman, Lewisville, Tex.

[73] Assignee: Lockheed Fort Worth Company, Fort Worth, Tex.

[21] Appl. No.: 08/345,114

[22] Filed: Nov. 28, 1994

[51] Int. Cl.[7] ........................ G01R 31/302; G01R 31/308
[52] U.S. Cl. ............................................. 324/750; 324/753
[58] Field of Search ................................... 324/750, 753, 324/715, 529, 530

[56] References Cited

U.S. PATENT DOCUMENTS

| | | | |
|---|---|---|---|
| 3,992,663 | 11/1976 | Seddick | 324/529 |
| 4,186,338 | 1/1980 | Fichtenbaum | 324/521 |
| 4,761,607 | 8/1988 | Shiragasawa et al. | 324/752 |
| 5,087,873 | 2/1992 | Murphy et al. | 324/71.2 |
| 5,412,330 | 5/1995 | Ravel et al. | 324/753 |
| 5,485,080 | 1/1996 | Larrabee et al. | 324/158.1 |

*Primary Examiner*—Josie Ballato
*Assistant Examiner*—Russell M. Kobert
*Attorney, Agent, or Firm*—Gray Cary Ware & Freidenrich, LLP

[57] ABSTRACT

A system for evaluating defects and determining unknown parameters is provided which includes an AC source (10) coupled to a device under test (36). A radiation detector (16) detects radiation emitted from interrupted electrons flowing in the surface of the device under test (36). An analyzer (18) is coupled to the detector (16) for analyzing the output of the detector (16). A processor and memory system (38) is coupled to the analyzer (18) to assist in making determination as to defects or unknown properties of the device under test (36).

22 Claims, 2 Drawing Sheets

METHOD AND APPARATUS FOR DETECTING EMITTED RADIATION FROM INTERRUPTED ELECTRONS

TECHNICAL FIELD OF THE INVENTION

This invention relates generally to electronic testing and measurement, and more particularly to a method and apparatus for detecting emitted radiation from interrupted electrons associated with alternating currents.

BACKGROUND OF THE INVENTION

Various techniques exist for detecting and analyzing defects in products of all kinds. Ideally, every unit produced would be analyzed for defects. Unfortunately, it is often extremely expensive to analyze every single one. Therefore, most defect detection and analysis systems analyze only a sample of all units produced.

As an example, a particular area where defect analysis is very important is the production of integrated circuits. Because of the relatively complex process required to produce and package integrated circuits, opportunities for defects are significant. However, testing of integrated circuits can be very expensive, and thus often only a sampling of the chips are tested.

Within the area of integrated circuit production, significant defect problems arise in connection with bond wires that connect the integrated circuit chip to the pins that allow connection with other circuit components. These bond wires are typically hair-thin conductors, such as gold, copper, aluminum, or other materials. A discontinuity in any of these bond wires can render an integrated circuit completely inoperable, and unless every single chip is tested, most defects will go undetected until the products using them fail.

The need to analyze defects in all units, rather than in just a random sample of units, is particularly apparent for products that will be used in safety-sensitive applications, such as airplanes. For example, the failure of an integrated circuit in a computer-controlled jet aircraft can cause dangerous malfunctions within the aircraft.

SUMMARY OF THE INVENTION

Therefore, a need has arisen for a method and an apparatus for detecting and analyzing product defects, such as those in integrated circuits, at high speed and low cost. Furthermore, a need has arisen for a method and an apparatus for analyzing defects in surface features of various products. In accordance with the teachings of the present invention, a method and an apparatus for detecting emitted radiation from interrupted electrons is provided which substantially eliminates or reduces disadvantages and problems associated with prior defect analysis systems.

In particular, a system for evaluating defects is provided which includes a source of alternating current. A device to be evaluated for defects is coupled to the source, the device having a surface. A radiation detector is used to detect radiation emitted from the surface and to generate an output based on the detected radiation. The radiation is caused by current flow in the surface. An analyzer is used to perform an analysis of the output. In a particular embodiment, the device being evaluated is an integrated circuit and lead frame, and the surface from which radiation is emitted are bond wire surfaces.

Also provided is a system for measuring an unknown parameter of a material, in which a source of alternating current is coupled to the material. A radiation detector is used to detect radiation emitted from the material and to generate an output based on the detected radiation. The radiation is caused by current flow in a surface of the material. An analyzer is used to measure the intensity of the detected radiation. Coupled to the analyzer is a processor operable to determine the parameter by comparing the measured intensity with a reference. In a particular embodiment, the reference comprises a profile of radiation intensity versus surface roughness for the material, and wherein the parameter is surface roughness. In another embodiment, the parameter comprises the density of the material.

Also provided is a method of evaluating defects, in which an alternating current is applied to a device to be evaluated for defects, the device having a surface. Radiation emitted from the surface is detected, the radiation being caused by current flowing in the surface. An output based on the detected radiation is generated, and an analysis of the output is performed. In a particular embodiment, the device being tested is an integrated circuit and lead frame, and the surface comprises bond wire surfaces.

An important technical advantage of the present invention is the fact that high-speed, low-cost defect evaluation is performed through use of radiation detector. Therefore, the devices to be tested can be tested without contacting them or destroying them.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
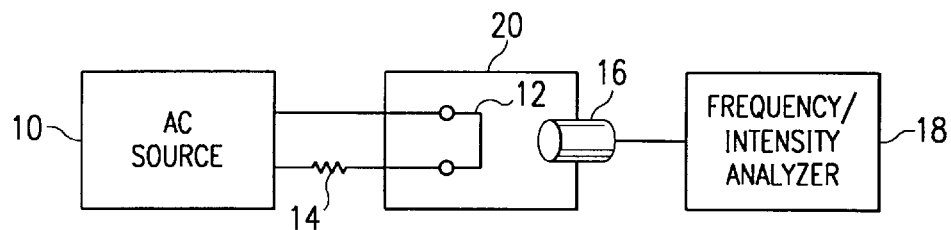
FIG. 1 illustrates a block diagram of a system for detecting emitted radiation from interrupted electrons from alternating electrical currents according to the teachings of the present invention.

FIG. 1 illustrates a block diagram of a system for detecting and analyzing emitted radiation from interrupted electrons according to the teachings of the present invention. As shown in FIG. 1, an AC source 10 is coupled to a wire 12 from which radiation will be emitted. Wire 12 is an uninsulated wire. In a particular example, wire 12 is copper, although any other conductive material, such as gold or aluminum, may also be used. A load 14 is coupled in series with the wire 12 so as to regulate current flow through the wire 12. A detector 16 is disposed adjacent to the wire 12. Detector 16 is a detector capable of detecting emitted radiation from electrons that flow through wire 12. Thus, detector 16 may be any detector capable of detecting radiation, such as a photodetector or a silicon detector. A particular detector that may be used for detector 16 is the Silicon Detector Model UV-215VQ marketed by the EG&G Judson Company. Other radiation detectors may be used as well.

Detector 16 is coupled to a frequency/intensity analyzer 18. Analyzer 18 is operable to measure and analyze the intensity of radiation emitted by wire 12 and the frequency of modulation of the intensity. A particular frequency analyzer that may be used for analyzer 18 is the Model 35665A marketed by the Hewlett-Packard Company.

As shown in FIG. 1, the wire 12 and the active area of the detector 16 are enclosed within a housing 20. This housing 20 is a "dark" housing, as it shields the detector 16 from most all radiation except that emitted by wire 12.

For alternating current above about 500 hertz, most electrons flow in an electron plasma at the surface of the wire 12. As the electrons flowing along the surface meet discontinuities, gouges, bumps, bends, spires, wavy zones, holes, impurities or other imperfections that deviate from perfect smoothness, the electrons decelerate and fall to lower energy states, thus emitting photons. The photons are generally in the ultraviolet region of the spectrum. Thus, the detector 16 is biased for UV detection. However, other energy photons may also be emitted, for example, as the material of the wire 12 changes, and thus different detectors biased for different regions of the spectrum may be used as well.

The intensity of the emitted radiation is directly proportional to the magnitude of the current. Furthermore, because the imperfections that result in radiation emission are periodically encountered at the same frequency as that of the current flowing along the surface of the wire, the intensity of radiation emitted by the wire will have the same frequency content as that of the current flowing through the wire. If more than one frequency is imposed upon the wire, then the intensity of the emitted radiation will have frequency components corresponding to each of those signals imposed on the wire 12. The frequency/intensity analyzer 18 measures and analyzes these various frequency components. Various frequencies may be imposed by the AC source. For example, frequencies in the range of 500–100,000 Hz have been successfully used, although frequencies outside of this range may be used as well.

Figure 2:
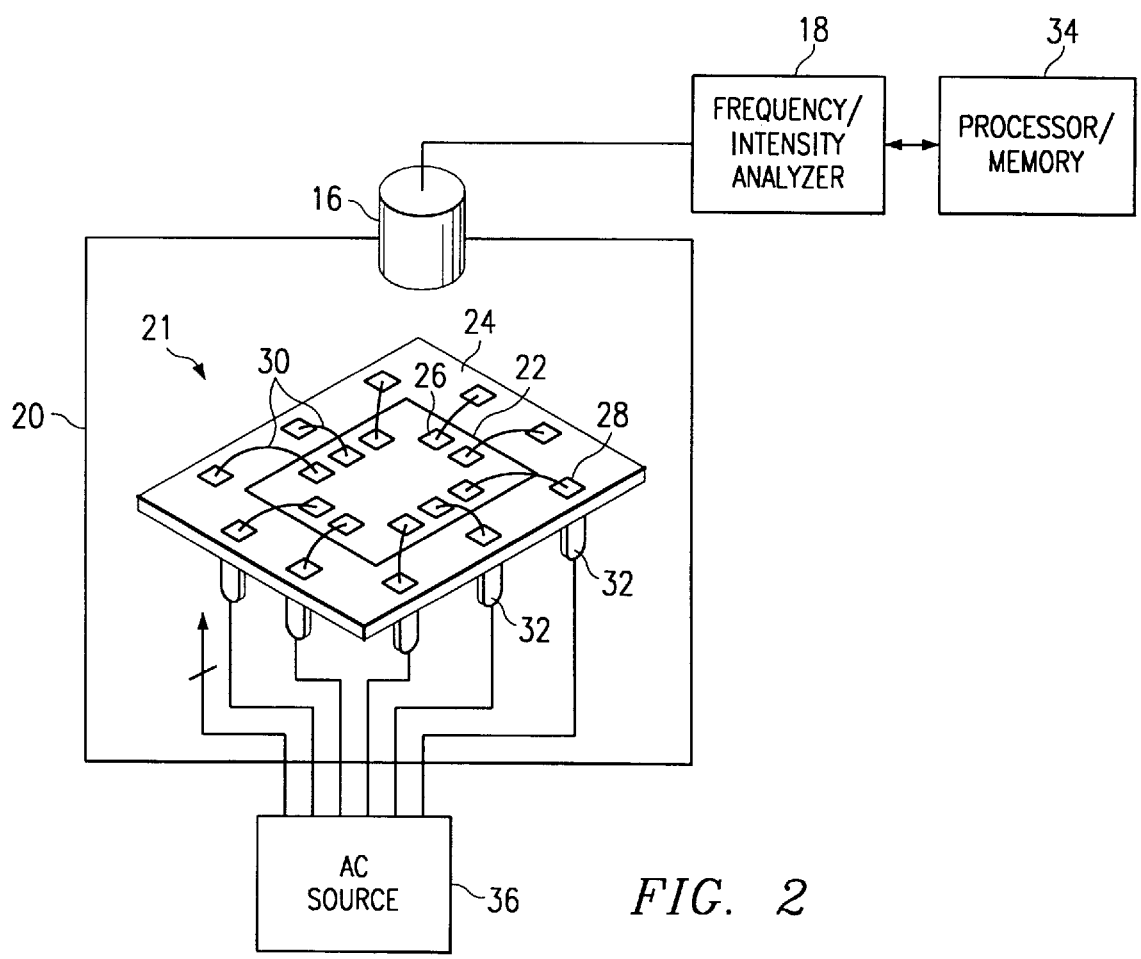
FIG. 2 is a block diagram of a system for detecting defects in microchips according to the teachings of the present invention.

FIG. 2 illustrates a block diagram of a particular system for detecting and analyzing defects in microchips according to the teachings of the present invention. As shown in FIG. 2, a microchip 21 includes an integrated circuit 22 disposed on a lead carrier 24. The term "lead carrier" refers to any device to which an integrated circuit is coupled through bond wires. Bond pads 26 on the integrated circuit 22 are coupled to bond pads 28 of the lead carrier 24 through bond wires 30. These bond wires are typically fine, uninsulated conductors. For example, these bond wires may be made of gold, copper, aluminum, or other conductors, including alloy conductors. The bond pads 28 of the lead carrier 24 are, in turn, coupled to pins 32. These pins 32 allow connection of the integrated circuit 22 to other circuit components. Because these bond wires 30 are uninsulated, radiation emitted from the electrons travelling at their surface can be easily detected. The system of FIG. 2 can be used to detect such emissions before the integrated circuit 22 is encapsulated in a permanent package.

The detector 16 is used to detect emitted radiation from the bond wires 30. Detector 16 is coupled to analyzer 18, which is, in turn, coupled to the processor and memory system 34. Each of the pins 32 are coupled to AC source 36. AC source 36 applies AC signals, such as squarewaves, sinewaves, sawtooth waves, triangular waves, or any other AC signals to the pins 32. In turn, these AC signals induce AC currents on the bond wires 30.

If a bond wire is properly connected, radiation will be emitted by the wire and detected by detector 16. As discussed above, whenever the electrons in the surface of the bond wires encounter some area that departs from perfect smoothness, radiation will be emitted. Such imperfections exist to some degree in most any wire, and thus radiation will be present to be detected. If a disconnect in any of the bond wires 30 has occurred, no current will flow through that bond wire. Thus, there will be no radiation emitted from that disconnected bond wire to be detected by detector 16.

The AC source 36 imposes different frequencies on each bond wire 30. Thus, analyzer 18 will detect frequencies corresponding to each properly connected bond wire 30. If a bond wire 30 is not connected (open circuited), then the frequency of that wire will not be detected by the analyzer 18. Thus, the chip under test will be defective. Processor and memory system 34 is used to analyze the frequency and intensity determinations made by analyzer 18 and to signal whether a particular microchip is defective. Furthermore, more than one microchip can be tested at once.

Figure 3:
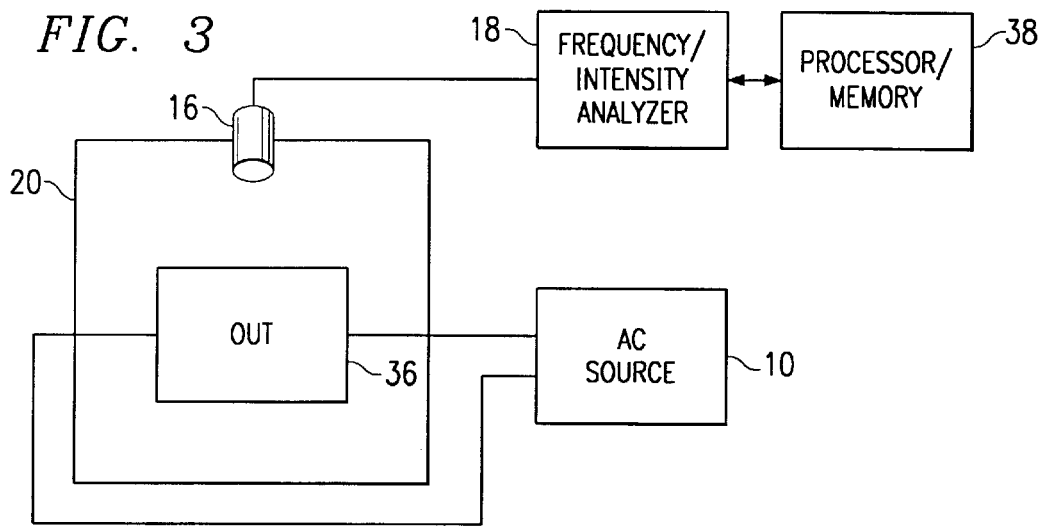
FIG. 3 is a block diagram of a system for detecting defects in surface features according to the teachings of the present invention.

FIG. 3 illustrates a block diagram of a particular system for measuring defects or impurities in surface features according to the teachings of the present invention. As shown in FIG. 3, a device under test ("DUT") 36 is placed within housing 20. DUT 36 is coupled to AC source 10. The output of analyzer 18 is coupled to a processor and memory system 38.

With the system shown in FIG. 3, an alternating current is passed across the surface of DUT 36. The intensity of the radiation emitted by the electrons flowing on the surface of the device under test 36 is measured by analyzer 18. The intensity of the emitted radiation is then compared with a known intensity by processor and memory system 38 to determine certain information about the device under test 36.

In particular, a non-defective device can be analyzed with the system of FIG. 3, and a reference intensity established and stored within processor and memory system 38. Then, subsequent devices to be tested are analyzed through the system of FIG. 3. If, for a DUT 36, the intensity received by detector 16 deviates by too much from the reference established by the non-defective reference device, then the DUT 36 is considered defective.

For example, it has been found that surface features such as curves, bends, dips, or impurities result in the emission of radiation when current is passed across them. For a device with non-defective, designed surface features, a particular intensity profile is established. Then, devices designed to have those features are tested. Deviations from the designed surface features will result in different intensity emissions. Thus, the intensity emissions from the tested devices are analyzed for purposes of determining whether the devices are within acceptable tolerances. Similarly, the shape of a material can be determined. For example, since a bend results in emitted radiation, bends can be determined from the intensity of the emitted radiation.

Figure 4:
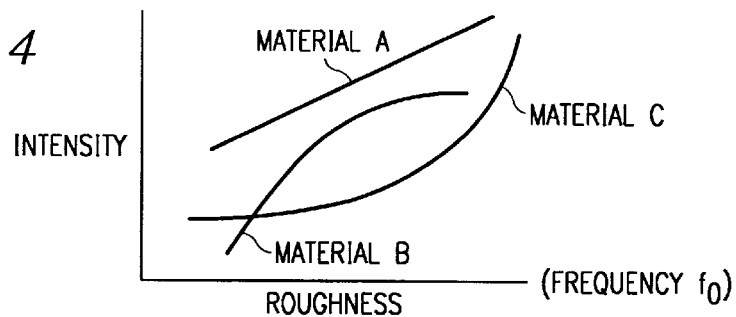
FIG. 4 is a graph of the intensity of emitted radiation from interrupted electron versus surface roughness.

As another example, the system of FIG. 3 can be used to determine the roughness of a particular material. Such determinations are important, for example, in dynamic random access memory ("DRAM") technology, wherein effective capacitor area (and thus capacitance) can be increased by roughening the electrodes of the storage capacitors. FIG. 4 illustrates a graph that may be established for various materials. The ordinate of the graph is intensity, while the abscissa is roughness. As shown in FIG. 4, for some materials, such as Material A, the intensity will increase approximately linearly with roughness. For other materials, such as Materials B and C, intensity may asymptotically or exponentially increase with roughness. The graph of FIG. 4 is for a particular AC frequency, it being understood that the curves may shift or change slopes for different frequencies.

With the system of FIG. 3, a particular material can be analyzed, and the radiation intensity measured. Then, using information from the graph of FIG. 4, the particular roughness of the material can be determined from the intensity of the radiation emitted.

Similarly, if the roughness of the material is known, the material can be determined by measuring the intensity. As can be seen in FIG. 4, however, the curves for certain materials cross. Thus, it may be possible to distinguish between those materials at those points by changing the frequency of AC source 10.

Figure 5:
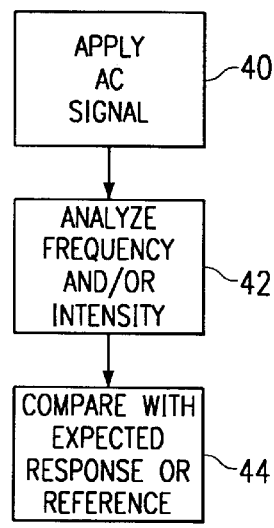
FIG. 5 is a flow diagram of a method of analyzing defects according to the teachings of the present invention.

FIG. 5 illustrates a flow diagram of a method of detecting and analyzing defects according to the teachings of the present invention. As shown in FIG. 5, an AC signal is applied to the device under test at step 40. This AC signal may have a single or multiple frequency components. For example, with the microchip detector discussed above in connection with FIG. 2, multiple AC frequencies may be applied to the various bond wires.

At step 42, the level and frequency content of the intensity of the radiation emitted from the device under test is analyzed. Thus, the relative magnitudes of the various frequency components and the intensity of the received radiation may be measured at step 42.

At step 44, the measured frequency or intensity level can be compared with an expected response or with a reference, as discussed above in connection with FIGS. 2–4. If the measured response is within an acceptable range, then the device tested may be considered to be without defect. However, if it is outside of that range, then a defect determination can be made.

An important advantage of this invention is the fact that devices can be tested rapidly, without destroying or modifying them. In particular, an optical system is used to measure radiation emitted when alternating currents are generated in bare wires or other surfaces.

Various components in the FIGUREs, such as the analyzer 18 and the processor and memory systems 34 and 38, are shown as separate components. It should be understood that these separations are logical only, and these and other components may be physically separate or contained on the same device. For example, the analyzer 18 and the processor and memory systems 34 and 38 may be part of a single computer system, such as a microprocessor based computer system.

Although the present invention has been described in detail, it should be understood that various modifications, substitutions, and additions may be made to this description without departing from the intended scope of the present invention as defined by the appended claims.

What is claimed is:

1. A system for evaluating defects, comprising:
   a source of alternating current;
   a device to be evaluated for defects coupled to said source, said device having a surface, and said source operable to produce current flow in said surface;
   a silicon radiation detector operable to detect ultraviolet light radiation emitted by said surface and to generate an output based on said detected ultraviolet light radiation, said emitted ultraviolet light radiation caused by said current flow in said surface; and
   an analyzer operable to perform an analysis of said output.

2. The system of claim 1, wherein said device is an integrated circuit and lead frame, and wherein said surface comprises bond wire surfaces.

3. The system of claim 1, wherein said defects being evaluated are deviations in designed surface features.

4. The system of claim 3, wherein said analyzer comprises a frequency analyzer.

5. The system of claim 1, further comprising a processor coupled to said analyzer, said processor operable to compare said analysis with a reference.

6. The system of claim 5, wherein said analysis is a frequency analysis of the intensity of said emitted radiation.

7. The system of claim 5, wherein said analysis is a measurement of the intensity of said emitted radiation.

8. The system of claim 5, wherein said reference comprises a frequency profile of the intensity of radiation emitted from a non-defective device.

9. The system of claim 5, wherein said reference comprises an intensity profile of radiation emitted from a non-defective device.

10. A system for evaluating defects, comprising:
    a source of alternating current;
    an integrated circuit and lead frame to be evaluated for defects coupled to said source, said integrated circuit and lead frame having a surface, said surface comprising surfaces of a plurality of bond wires, and said source operable to induce currents at different frequencies on each respective bond wire;
    a radiation detector operable to detect radiation emitted by said surface and to generate an output based on said detected emitted radiation, said emitted radiation caused by said current flow in said surface; and
    an analyzer operable to perform an analysis of said output.

11. A system for measuring surface roughness of a material, comprising:
    a source of alternating current, said source coupled to the material, and said source operable to produce current flow in the material;
    a radiation detector operable to detect radiation emitted by the material and to generate an output based on said detected emitted radiation, said emitted radiation caused by said current flow in a surface of the material;
    an analyzer operable to measure the intensity of said detected emitted radiation; and
    a processor coupled to said analyzer, said processor operable to determine the surface roughness by comparing said measured intensity with a reference, wherein said reference comprises a profile of radiation intensity versus surface roughness for the material.

12. A system for determining the identity of a material, comprising:
    a source of alternating current, said source coupled to the material, and said source operable to produce current flow in the material;
    a radiation detector operable to detect radiation emitted by the material and to generate an output based on said detected emitted radiation, said emitted radiation caused by said current flow in a surface of the material;
    an analyzer operable to measure the intensity of said detected emitted radiation; and
    a processor coupled to said analyzer, said processor operable to determine the identity of the material by comparing said measured intensity with a reference, wherein said reference comprises a profile of radiation intensity versus surface roughness for known materials.

13. The system of claim 12, wherein said detector comprises a silicon detector operable to detect ultraviolet light.

14. A method of evaluating defects, comprising:
applying an alternating current to an integrated circuit and lead frame to be evaluated for defects, the integrated circuit and lead frame having a surface, said surface comprising surfaces of a plurality of bond wires, such that said alternating current induces currents at different frequencies on each respective bond wire;
detecting radiation emitted by said surface, the radiation caused by said current flow in said surface;
generating an output based on said detected emitted radiation; and
performing an analysis of said output.

15. The method of claim 14, wherein performing an analysis comprises performing a frequency analysis of intensity of said emitted radiation.

16. The method of claim 15, wherein a defect is found if the frequency analysis reveals that less than all frequencies induced on the bond wires are present in the intensity of said emitted radiation.

17. The method of claim 14, wherein the defects being evaluated are deviations in designed surface features.

18. The method of claim 14, further comprising comparing the analysis with a reference.

19. The method of claim 18, wherein the analysis is a frequency analysis of intensity of said emitted radiation.

20. The method of claim 18, wherein the analysis is a measurement of intensity of said emitted radiation.

21. The method of claim 18, wherein the reference comprises a frequency profile of intensity of radiation emitted from a non-defective device.

22. The method of claim 18, wherein the reference comprises an intensity profile of radiation emitted from a non-defective device.

* * * * *